US006845346B1

United States Patent
Arunachalam et al.

(10) Patent No.: US 6,845,346 B1
(45) Date of Patent: Jan. 18, 2005

(54) ITERATIVE METHOD OF PARASITICS ESTIMATION FOR INTEGRATED CIRCUIT DESIGNS

(75) Inventors: Prakash S. Arunachalam, Portland, OR (US); Pankaj Kukkal, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/457,675

(22) Filed: Dec. 9, 1999

(51) Int. Cl.[7] ............................................. G06F 17/50
(52) U.S. Cl. ............................................. 703/2; 716/12
(58) Field of Search .......................... 703/2, 14, 16; 716/6, 16, 18, 12

(56) References Cited

U.S. PATENT DOCUMENTS

| | | | | |
|---|---|---|---|---|
| 5,629,860 A | * | 5/1997 | Jones et al. | 364/490 |
| 5,754,826 A | * | 5/1998 | Gamal et al. | 395/500 |
| 5,889,677 A | * | 3/1999 | Yasuda et al. | 364/488 |
| 6,175,947 B1 | * | 1/2001 | Ponnapalli et al. | 716/5 |
| 6,286,126 B1 | * | 9/2001 | Raghavan et al. | 716/6 |
| 6,286,128 B1 | * | 9/2001 | Pileggi et al. | 716/18 |
| 6,305,004 B1 | * | 10/2001 | Tellez et al. | 716/12 |
| 6,381,730 B1 | * | 4/2002 | Chang et al. | 716/5 |
| 6,385,761 B1 | * | 5/2002 | Breid | 716/8 |
| 6,463,567 B1 | * | 10/2002 | Kozai | 716/2 |
| 6,507,938 B1 | * | 1/2003 | Roy-Neogi et al. | 716/10 |

OTHER PUBLICATIONS

Hanan, M., "On Steiner's Problem with Rectilinear Distance", *Siam Journal on Applied Mathematics*, vol. 14, No. 2, pp. 255–265, Mar. 1966, Society for Industrial and Applied Mathematics, Philadelphia, Pennsylvania.

* cited by examiner

Primary Examiner—Thai Phan
(74) Attorney, Agent, or Firm—Kenyon & Kenyon

(57) ABSTRACT

A parasitics estimation method for an integrated circuit estimates a geometry graph of an interconnect with reference to cells of an imaginary grid system that overlays the area of the integrated circuit. Cells are identified as including a path of the interconnect. A geometry graph of the interconnect is estimated as crossing the centers of cell boundaries along the interconnected path. Parasitic estimation is performed taking the interconnect path to be the geometry graph.

11 Claims, 5 Drawing Sheets

ITERATIVE METHOD OF PARASITICS ESTIMATION FOR INTEGRATED CIRCUIT DESIGNS

BACKGROUND

Embodiments of the present invention relates to an iterative technique that estimates parasitic effects in an integrated circuit based on interconnect geometry estimations.

As is known in integrated circuit design, it is desirable to avoid transmission delays that may occur when transmitting data across interconnect within an integrated circuit ("IC"). "Interconnect" refers generally to data buses internal to an IC. Conventionally, delay has been dominated by transmitter and receiver circuitry at terminal ends of the interconnect. But more recently, transmission delays are being dominated by RC delay of the interconnect itself. Parasitic effects that are imposed upon the interconnect by other components of the IC are a major cause of RC delay. They are determined to a great degree by the topology of the interconnect and by the proximity of the interconnect to the other components. Parasitic effects can interfere with the propagation of data signals on the interconnect and, consequently, can cause timing requirements for such data signals to be missed. Accordingly, designers of ICs must account for these parasitic effects as they design the ICs.

Conventionally, designers have performed two calculations of parasitic effects during the design stage. A first parasitic calculation is an estimation that typically is performed very early in the circuit design stage when very little is known about the topology of the IC. Parasitic estimation at the early stage typically is based upon certain assumptions based on worst-case approximations of circuit topology and interconnect geometries. The early estimate produces very general parasitic estimations and typically were used only to confirm the feasibility of certain topologies and certain timing schemes.

A second parasitic calculation is a parasitic "extraction" that typically is performed very late in the circuit design stage when precise component layouts and interconnect geometries have been defined. This later parasitic estimation is much more accurate than the earlier estimation that is done before circuit layout occurs. The extraction actually calculates RC effects that will be imposed on every wire of the interconnect based upon that wire's neighbors. The later parasitic extraction determines whether the feasibility studies of the earlier parasitic estimation remain valid and whether the interconnect is likely to meet the timing requirements on which other components depend. In some cases, the extraction will reveal that the parasitic effects are likely to cause the interconnect ('the net') to fail its timing requirements. In this case, circuit designers must redesign the circuit or the interconnect geometry to find a design solution for which the parasitics pass the interconnect timing requirements.

Several tools are available to perform parasitic extraction. They include the Calibre and xCalibre products commercially available from Mentor Graphics Corporation of Wilsonville, Oreg. These extraction tools require the IC to be completely designed, both the interconnect and the other components, before extraction is possible.

The conventional two-stage parasitic estimation/extraction process is disadvantageous because it is based on a hit-or-miss approach; it does not converge iteratively on a valid circuit design. Typically, an early estimation is performed, then the results are shelved, possibly for several years, until the circuit design becomes sufficiently concrete for the extraction to be performed. Circuit designers can devote substantial resources building a circuit design based upon a favorable early parasitic estimation only to learn from a parasitic extraction that the IC design does not satisfy the IC's timing requirements. A circuit designer may be forced to undertake substantial resources in IC redesign under this method.

Accordingly, there is a need in the art for a parasitics estimation technique that is available for use throughout the circuit design process. There is a need for such an estimation technique that enables a design process that converges upon a design solution that meets timing requirements for internal interconnect within an IC.

SUMMARY OF THE INVENTION

Embodiments of the present invention provide a parasitics estimation method. For an integrated circuit. According to the method, cells of an imaginary grid system that overlays the area of the integrated circuit are identified as including a path of an interconnect. A geometry graph of the interconnect is estimated as crossing the centers of cell boundaries along the interconnected path. Parasitic estimation is performed taking the interconnect path to be the geometry graph.

DETAILED DESCRIPTION

The present invention provides an automated parasitics estimation process that uses all available design parameters for routing topology. According to an embodiment, the present invention generates a geometry graph for an interconnect based upon whatever definitional constructs are available for the interconnect at the time that the method is operating. Once the geometry graph is generated, electrical modeling, parasitic estimations and timing analysis becomes possible.

Figure 1:
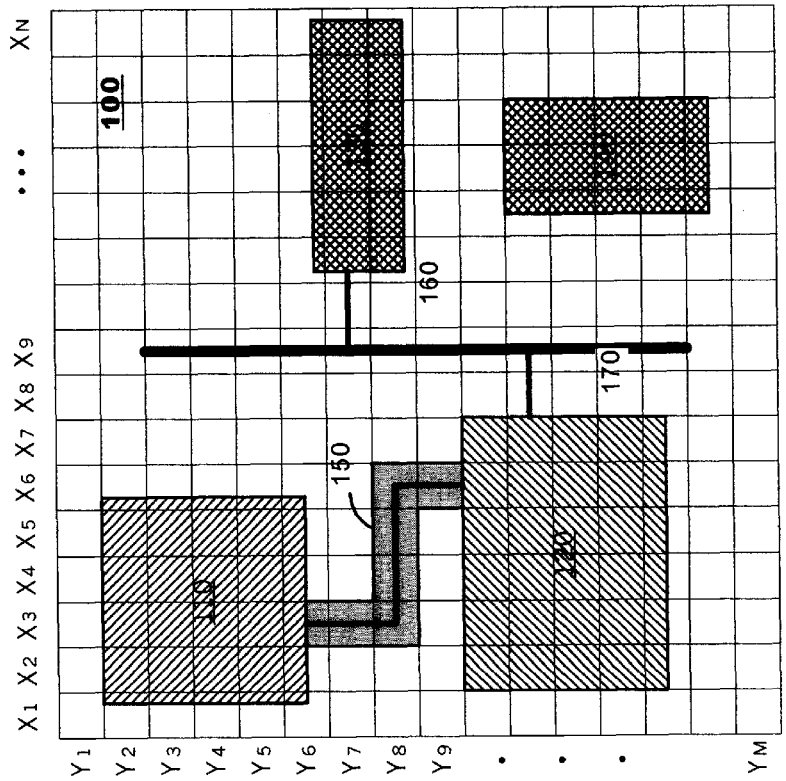
FIG. 1 illustrates an exemplary integrated circuit.

FIG. 1 illustrates the layout of an exemplary integrated circuit. As is known, most ICs include a plurality of functional unit blocks ("FUBs"), each FUB having been allocated a predetermined amount of area on the circuit. Exemplary FUBs 110–140 are shown in the IC. The IC also includes a plurality of other logic circuits (not shown) occupying other areas on the circuit. Routing refers to the provision and layout of data paths between one or more FUBs.

Conventionally, IC interconnects are routed first globally, then locally according to a divide-and-conquer approach.

With reference to an imaginary grid system that divides the surface area of an IC into cells, the interconnect is routed globally when the cells through which the interconnect extends are identified. Local routing is done on a cell-by-cell basis. The path of the interconnect through each cell is defined. Local routing of each cell typically is performed independently of local routing for each other cell except that "crosspoints," the point on a cell boundary where the interconnect crosses from one cell to the next cell, must be common for two adjacent cells.

According to an embodiment, the techniques of the present invention may be used throughout the process of designing an IC. As has been noted above, the layout of an IC evolves over time. Initially, the layout of an IC may be quite abstract—for each FUB, there may be a general description of the location of the FUB and the area that it will occupy. At the final design stages, the location and interconnection of every transistor of every FUB may be defined precisely.

Figure 2A:
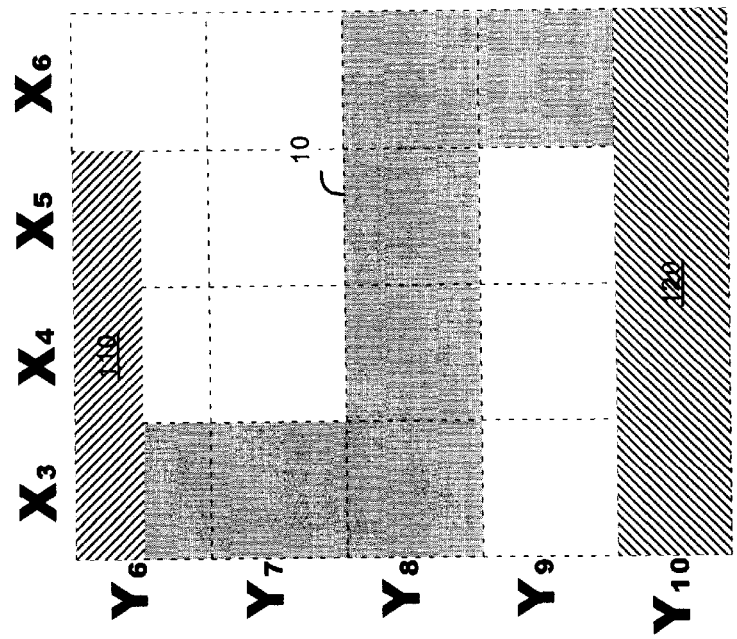
FIGS. 2(a)–(c) illustrate interconnect design specifications at successive times during integrated circuit design.

Typically, interconnect routing also evolves during the design of the IC. The layout of an interconnect begins with only an abstract definition of a route through the grid. For example, initially the interconnect may be identified only by the grids through which it will traverse. FIG. 2(a) illustrates an interconnect to be routed between FUBs 110 and 120 across grids $X_3Y_6$, $X_3Y_7$, $X_3Y_8$, $X_4Y_8$, $X_5Y_8$, $X_6Y_8$ and $X_6Y_9$.

Figure 2C:
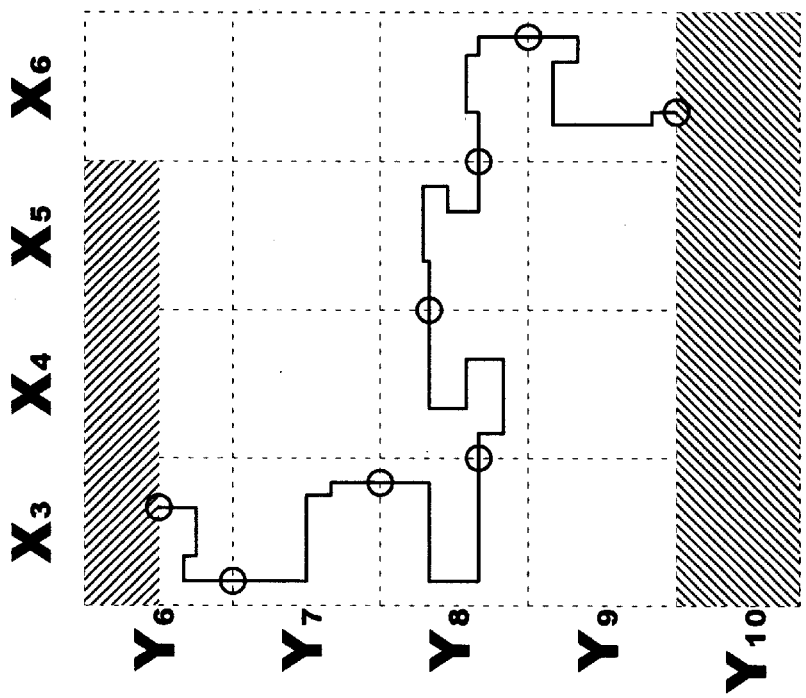
Figure 2B:
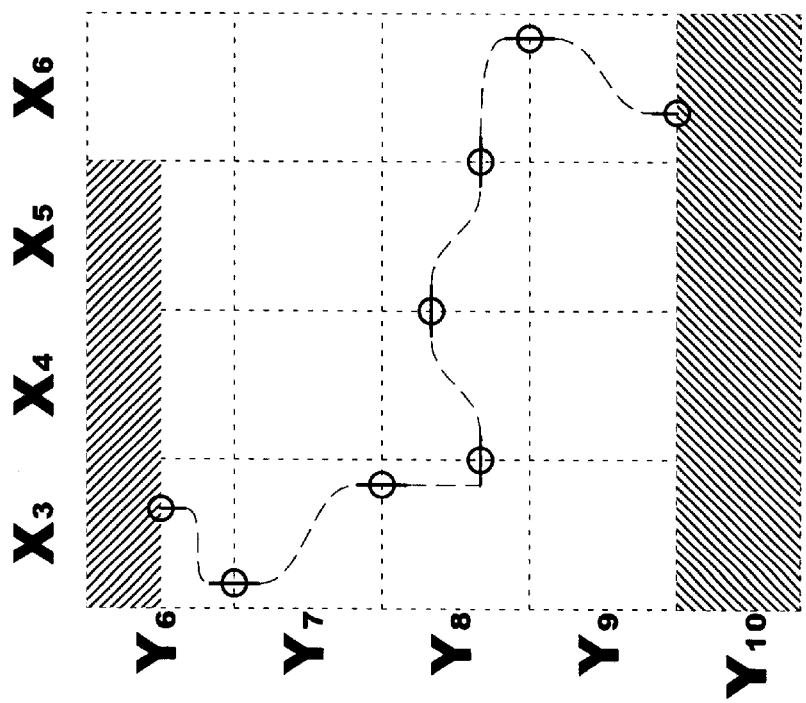

The design of an interconnect iteratively becomes more precise. At some point, crosspoints may be defined for the interconnect. At this stage, the geometry of the interconnect may not be known within each cell but it is known where the interconnect crosses between cells. FIG. 2(b) illustrates an interconnect definition that is identified by the crosspoints between grids.

Finally, the geometry of the interconnect will be defined. The interconnect will cross between grids at the predetermined crosspoints as discussed above. Additionally, the interconnect's geometry within the grid will have been defined. A completely routed interconnect is shown in FIG. 2(c).

Embodiments of the present invention use the various definitional constructs of an interconnect to estimate parasitics for the interconnect. According to an embodiment of the present invention, a method is provided to estimate an interconnect geometry according to the best layout information that is available at the time.

Figure 3:
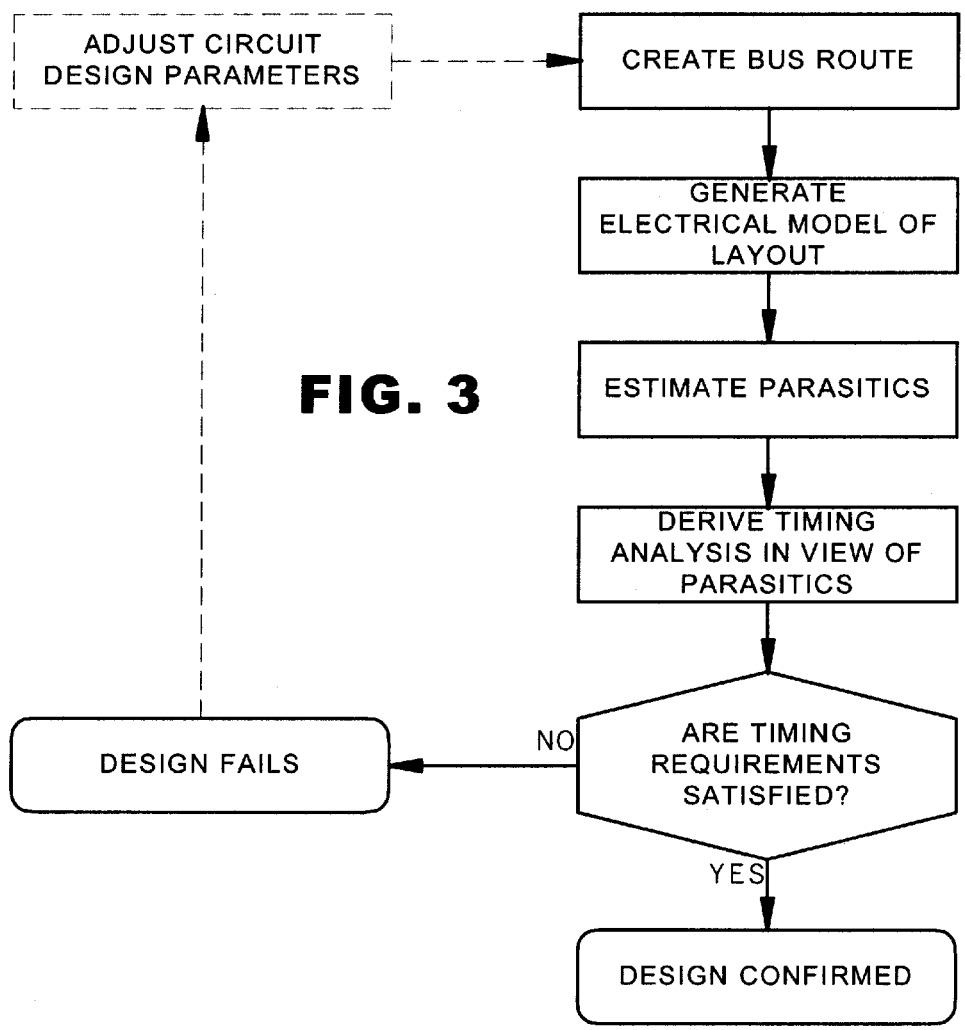
FIG. 3 illustrates a method according to an embodiment of the present invention.

FIG. 3 illustrates a method 1000 according to an embodiment of the present invention. According to the method, a geometry graph of an interconnect is generated according to the interconnect definition then available for the IC (Step 1010). This geometry graph estimates a path of the interconnect through the IC. Using the estimated interconnect geometry, electrical characteristics of the interconnect are modeled and the parasitic effects imposed by neighboring circuits also are modeled (Steps 1020, 1030). The timing requirements of the interconnect are considered in light of the parasitic effects (Step 1040). The method then determines whether the timing requirements of the estimated interconnect geometry are likely to be satisfied in view of the parasitic effects (Step 1050). If so, the interconnect geometry is validated (Step 1060); otherwise the interconnect geometry is identified as failing the timing requirements (Step 1070).

As described above, geometry graphs are constructed according to the best information available for the interconnect. The following list presents exemplary definitions that may apply to the interconnect:

An interconnect may be completely unrouted. According to an embodiment, a geometry graph may be estimated according to the well-known Steiner estimation technique. See, for example, M. Hanan, *On Steiner's Problem With Rectilinear Distance*, SIAM Journal of Applied Mathematics, 14 (1966), pp. 255–265.

Figure 4:
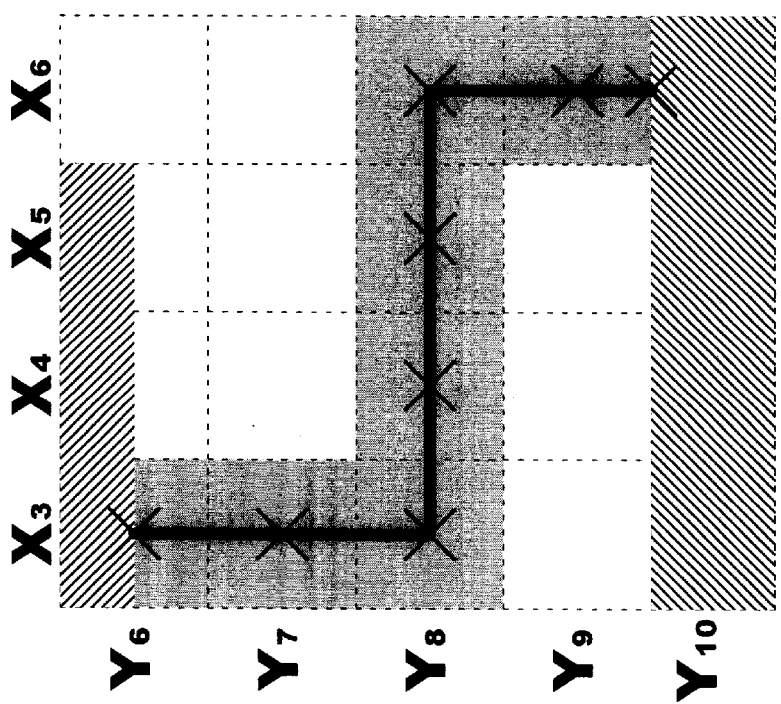
FIG. 4 illustrates an interconnect geometry according to a global routed net without crosspoints according to an embodiment of the present invention.

When an interconnect is defined as a global routed net without crosspoints, it identifies only the cells through which the interconnect is expected to traverse (See FIG. 2(a)). For those global routed nets without crosspoints, the interconnect is drawn to traverse the shortest distance between the centerpoints of boundary edges between cells; typically the interconnect traverses the centers of the cells themselves unless it would cause the path length of the interconnect to exceed a different shortest path. FIG. 4 illustrates an interconnect geometry drawn for the global routed net of FIG. 2(a). Cells $X_3Y_7$, $X_4Y_8$, and $X_5Y_8$, for example, illustrates the interconnect geometry extending through the centers of the cells themselves (shown as an X in phantom) Cells $X_3Y_8$ and $X_6Y_8$ illustrate the interconnect geometry extending through the boundary edges between cells but not though the cell centers.

Figure 5:
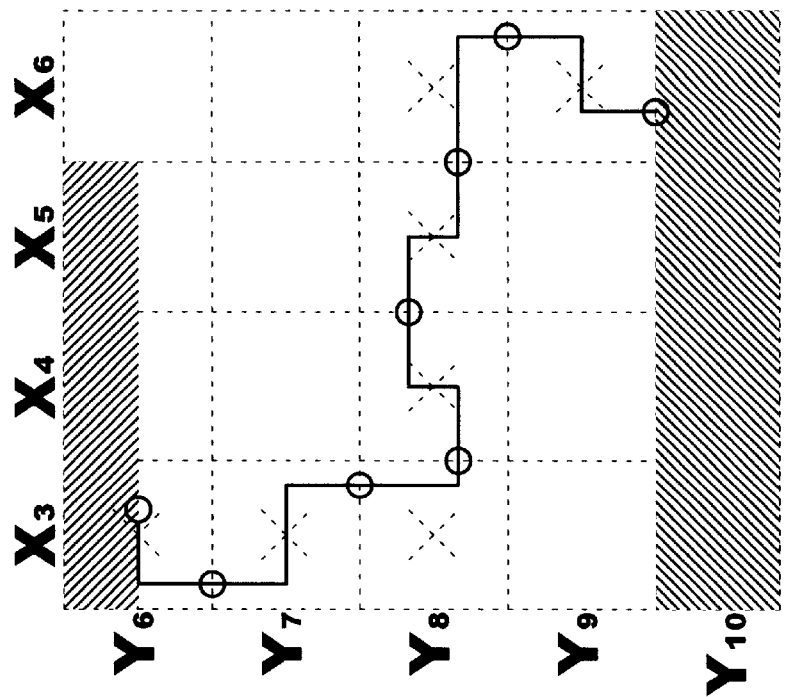
FIG. 5 illustrates an interconnect geometry according to a global routed net with crosspoints according to an embodiment of the present invention.

When an interconnect is defined as a global routed net with crosspoints, it identifies both the cells through which the interconnect extends and also coordinates of the points where the interconnect crosses from one cell to the next (See, FIG. 2(b)). According to an embodiment, for those global routed nets with crosspoints (or portions thereof), wire segments of the interconnect are drawn within each cell from a first crosspoint to the centerpoint of the cell and from the centerpoint to the second crosspoint. Wire segments extend in directions parallel to only one edge of the grid cell. FIG. 5 illustrates an exemplary interconnect drawn for the global routed net with crosspoints of FIG. 2(b). Thus, when an interconnect is defined by the crosspoints through which it extends, the interconnect is taken to interconnect the centerpoints of cells via the connective crosspoints.

Of course, when an interconnect is completely routed, an estimated geometry graph simply is taken to be the interconnect itself. Electrical modeling and parasitic estimation may be performed on the completely routed interconnect.

Returning to FIG. 3, according to an embodiment of the present invention, if an interconnect fails the timing analysis at Step 1070, circuit design parameters may be re-evaluated (Step 1080) and the method 1000 may be repeated using redefined interconnect characteristics defined in Step 1080.

Figure 6:
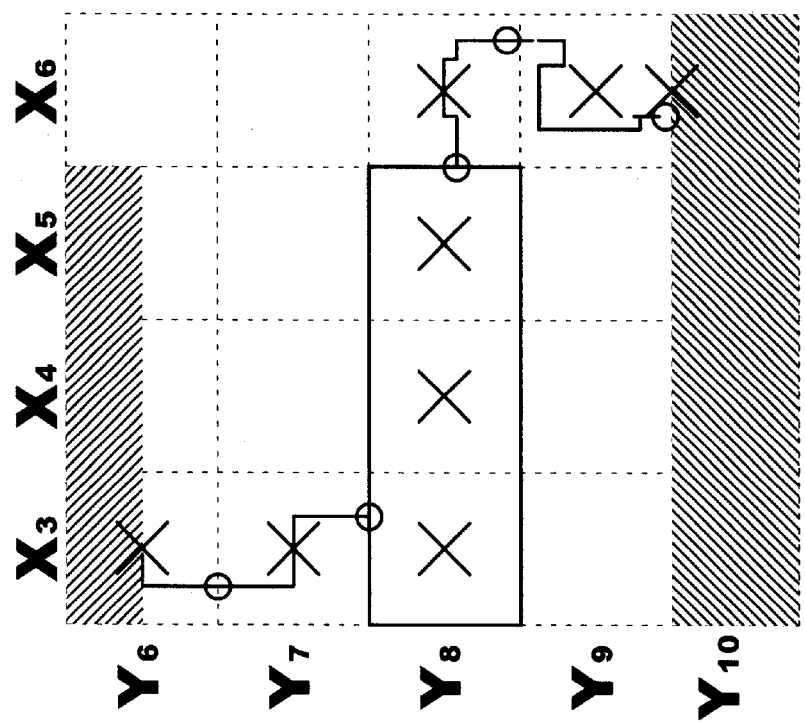
FIG. 6 illustrates an exemplary interconnect geometry that may be used with embodiments of the present invention.

According to an embodiment of the present invention, interconnect definitions may be different for each cell. As is known, interconnect routing may progress according to a divide-and-conquer approach wherein, once the interconnect is routed globally, local routing in one cell is independent from the local routing of another cells. Thus, as shown in FIG. 6, a first portion of an exemplary interconnect may be defined as a global routed net with cross-points (cells $X_3Y_6$ and $X_3Y_7$), a second portion of the interconnect may be defined as a global routed net without cross-points (cells $X_3Y_8$, $X_4Y_8$ and $X_5Y_8$) and a third portion of the interconnect may be defined as a completely routed net (cells $X_6Y_8$, $X_6Y_9$). Although not shown in FIG. 6, other portions of an interconnect may be completely unrouted. Thus, according to an embodiment, the geometry graph estimation may be performed on a cell-by-cell basis.

The prior discussion of interconnects has described them as if they are contained in a single plane. Conventionally, however, an integrated circuit typically includes a number of stacked layers. An interconnect may traverse the layers. Thus crosspoints may define not only the horizontal or vertical point at which an interconnect crosses between cells, but also the layer in which the crosspoint is located. The previously described embodiments of the present invention find application with such multi-layer ICs.

Figure 7:
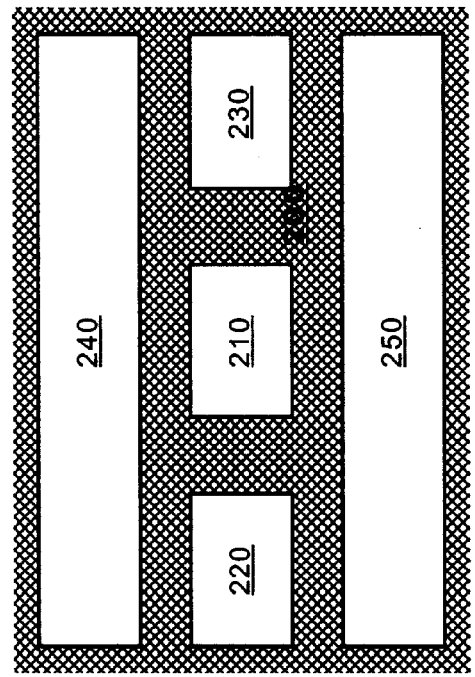
FIG. 7 illustrates a worst-case electrical model that may be used with the present invention.

Electrical modeling and parasitic estimation may be performed according to those methods that are conventional in the art. According to one embodiment, the electrical modeling may be performed based on a coverage-based worst-case assumption of parasitic effects imposed on each wire of the interconnect. FIG. 7 illustrates the worst-case model that may be used. For a given wire 210 in the interconnect, it may be assumed that the wire 210 is bordered on either side by a pair of wires 220, 230. Further, it may be assumed that the wire 210 may be provided between two planar conductors 240, 250. The planar conductors 240, 250 are assumed to be positioned above and below the entire width of the wire 210. All surrounding conductors 220–250 may be assumed to be grounded. Using such a model for each wire 210, electrical modeling and parasitic estimation becomes straightforward. Such a model generates worst-case parasitic effects upon the wire 210 and ensures that any timing effects that would be imposed on an actual interconnect constructed from the estimated geometry graph would be less severe than those parasitics calculated according to the described embodiments of the present invention.

The parasitic estimation techniques disclosed above have been run on actual integrated circuits being designed by the assignee of the present invention, Intel Corporation. The performance of these estimation techniques has been compared against the performance of known parasitic extraction applications, such as the Calibre and xCalibre applications commercially available from the Mentor Graphics Corporation. For an IC that includes 10,000 interconnects, an embodiment of the automated parasitic estimation method performs a complete parasitic estimation of the IC in approximately 3 hours. By contrast, the inventors estimate that a complete parasitic extraction on the same IC would take approximately three days. Of course, the parasitic extraction techniques cannot be applied to any interconnect except those that are completely routed. An embodiment of the parasitic estimation method calculates parasitic effects that are within 10% of those obtained by parasitic extraction techniques.

Several embodiments of the present invention are specifically illustrated and described herein. However, it will be appreciated that modifications and variations of the present invention are covered by the above teachings and within the purview of the appended claims without departing from the spirit and intended scope of the invention.

We claim:

1. An iterative method of estimating parasitic effects for an interconnect design in an integrated circuit, comprising:

with reference to an imaginary grid system overlaying an area of the integrated circuit, estimating a geometry graph for the interconnect, wherein:

for a portion of interconnect that is completely unrouted, the geometry graph is estimated according to a Steiner estimation, for a portion of the interconnect that is defined solely by identifiers of grid cells through which the interconnect extends, the geometry graph is drawn through centers of the respective grid cells, for a portion of the interconnect that is defined by identifiers of grids cells through which the interconnect is to extend and by identifiers of crosspoints between the cells, the geometry graph is drawn through centers of the respective grid cell and through the crosspoints, and for a portion of the interconnect that is completely routed, the geometry graph is taken to be the routed interconnect, and modeling parasitic effect upon the geometry graph.

2. The method of claim 1, further comprising determining timing characteristics of an interconnect based upon the estimated geometry graph.

3. The method of claim 2, further comprising validating the interconnect design if the timing characteristics exceed predetermined timing requirements for the interconnect.

4. The method of claim 1, wherein, for a portion of the interconnect that is defined solely by identifiers of grid cells through which the interconnect extends, the geometry graph is drawn to traverse the shortest distance between centerpoints or boundary edges between the grid cell.

5. The method of claim 1, wherein, for a portion of the interconnect that is defined by identifiers of grid cells through which the interconnect is to extend and by identifiers of crosspoints between the cells, the geometry graph is drawn by connecting wire segments of the interconnect.

6. The method of claim 5, wherein a first wire segment is drawn from a first crosspoint to a first centerpoint within the respective grid cell.

7. The method of claim 6, wherein another wire segment is drawn from the first centerpoint to a second crosspoint.

8. The method of claim 5, wherein the wire segments extend in directions parallel to only one edge of the respective grid cell.

9. The method of claim 1, wherein the integrated circuit includes a number of stacked layers.

10. The method of claim 9, wherein the interconnect traverses through the stacked layers.

11. A method of validating an interconnect design for an integrated circuit comprising:

with reference to an imaginary grid system overlaying an area of the integrated circuit, estimating a geometry graph of the interconnect, wherein:

for a portion of the interconnect that is completely unrouted, the geometry graph is estimated according to a Steiner estimation, for a portion of the interconnect that is defined solely by identifiers of grid cells through which the interconnect extends, the geometry graph extends through centers of the respective grid cells, for a portion of the interconnect that is defined by identifiers of grid cells through which the interconnect is to extend and by identifiers of crosspoints between the cells, the geometry graph extends through centers of the respective grid cell and through the crosspoints, and for a portion of the interconnect that is completely routed, the geometry graph is taken to be routed interconnect, and modeling parasitic effects upon the geometry graph, based on the modeled parasitic effects, determining timing characteristics of an interconnect based upon the estimated geometry graph, and validating the interconnect design if the timing characteristics exceed predetermined timing requirements for the interconnect.

* * * * *

UNITED STATES PATENT AND TRADEMARK OFFICE
CERTIFICATE OF CORRECTION

PATENT NO. : 6,845,346 B1
DATED : January 18, 2005
INVENTOR(S) : Prakash S. Arunachalam et al.

It is certified that error appears in the above-identified patent and that said Letters Patent is hereby corrected as shown below:

Column 6,
Line 7, "modeling parasitic effect" should be -- modeling parasitic effects --.
Line 18, "between the grid cell." should be -- between the grid cells. --.
Line 36, add a break so that claim 11 starts on new line.

Signed and Sealed this

Twenty-fifth Day of October, 2005

JON W. DUDAS
*Director of the United States Patent and Trademark Office*